(12) United States Patent
Shen et al.

(10) Patent No.: US 10,570,507 B2
(45) Date of Patent: Feb. 25, 2020

(54) APPARATUS AND METHOD FOR CONTROLLING OPERATION OF MACHINE

(71) Applicant: United Microelectronics Corp., Hsinchu (TW)

(72) Inventors: Neng-Hsing Shen, Hsinchu County (TW); Chien-Wen Yang, Hsinchu (TW); Chun-Man Li, Tainan (TW); Ji-Fu Kung, Taichung (TW); Ching-Pei Lin, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/950,152

(22) Filed: Apr. 10, 2018

(65) Prior Publication Data

US 2019/0276930 A1     Sep. 12, 2019

(30) Foreign Application Priority Data

Mar. 9, 2018   (CN) .......................... 2018 1 0193982

(51) Int. Cl.
*G06F 19/00*     (2018.01)
*C23C 14/54*     (2006.01)
*C23C 14/48*     (2006.01)
*H01L 21/66*     (2006.01)
*G06K 9/00*      (2006.01)
*G05B 15/02*     (2006.01)
*H01L 21/265*    (2006.01)

(52) U.S. Cl.
CPC .............. *C23C 14/54* (2013.01); *C23C 14/48* (2013.01); *G05B 15/02* (2013.01); *G06K 9/00624* (2013.01); *H01L 22/20* (2013.01); *G06K 2209/01* (2013.01); *H01L 21/265* (2013.01)

(58) Field of Classification Search
CPC ......... C23C 14/54; C23C 14/48; G05B 15/02; H01L 22/20; G06K 2209/01
USPC ........................................................ 700/108
See application file for complete search history.

(56) References Cited

U.S. PATENT DOCUMENTS

| | | |
|---|---|---|
| 5,910,011 A | 6/1999 | Cruse |
| 6,338,052 B1 | 1/2002 | Bae |
| 6,988,017 B2 | 1/2006 | Pasadyn et al. |
| 8,158,016 B2 | 4/2012 | Hayes et al. |
| 2004/0063009 A1* | 4/2004 | Phan .................. G03F 7/70525 430/30 |

(Continued)

*Primary Examiner* — Md Azad
(74) *Attorney, Agent, or Firm* — J.C. Patents

(57) ABSTRACT

An apparatus for controlling an operation of a machine includes an optical recognition system, a control unit, and a remote control interface. The optical recognition system is configured to monitor and obtain actual operation information displayed on a panel of a processing machine in accordance with an operation time. The control unit is configured to receive the actual operation information and check the actual operation information with expected operation information. The expected operation information is obtained based on an operation model which is already built up corresponding to a current fabrication process. Deviation information between the actual operation information and the expected operation information is determined and converted into a parameter set. The remote control interface receives the parameter set and converts the parameter set into a control signal set to control the operation of the processing machine.

18 Claims, 3 Drawing Sheets

(56) References Cited

U.S. PATENT DOCUMENTS

| | | | | |
|---|---|---|---|---|
| 2005/0221514 A1* | 10/2005 | Pasadyn | ................ | G05B 11/42 |
| | | | | 438/14 |
| 2006/0235560 A1* | 10/2006 | Ogawa | ............. | G05B 19/41875 |
| | | | | 700/109 |
| 2008/0179284 A1* | 7/2008 | Hayes | .................... | H01J 27/18 |
| | | | | 216/61 |
| 2010/0214317 A1* | 8/2010 | Miura | .................... | H04L 12/12 |
| | | | | 345/641 |
| 2015/0370245 A1* | 12/2015 | Sugishita | ................ | C23C 16/52 |
| | | | | 700/121 |

* cited by examiner

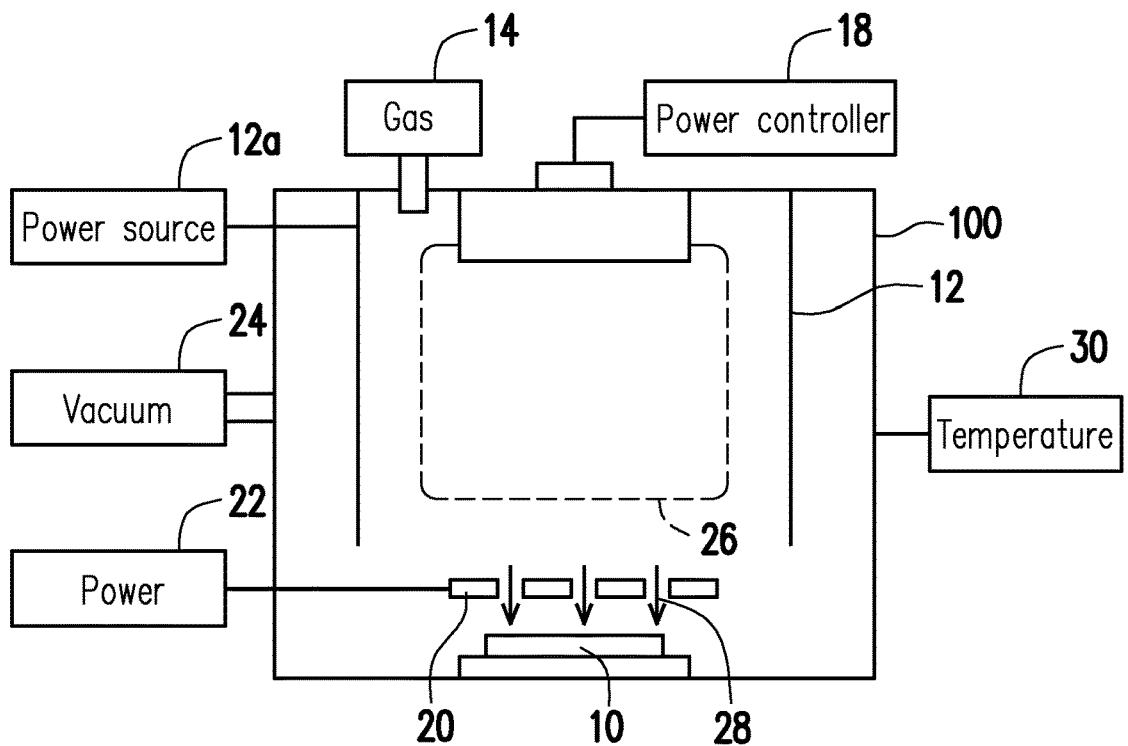

FIG. 5

| By an optical recognition system, monitoring and obtaining actual operation information displayed on a panel of a processing machine in accordance with an operation time | — S100 |

↓

| By a control unit, receiving the actual operation information and checking the actual operation information with expected operation information, wherein the expected operation information is obtained based on an operation model which is already built up corresponding to a current fabrication process, wherein deviation information between the actual operation information and the expected operation information is determined and converted into a parameter set | — S102 |

↓

| By a remote control interface, receiving the parameter set and converting the parameter set into a control signal set for controlling an operation of the processing machine | — S104 |

FIG. 6

APPARATUS AND METHOD FOR CONTROLLING OPERATION OF MACHINE

CROSS-REFERENCE TO RELATED APPLICATION

This application claims the priority benefit of China application serial no. 201810193982.9, filed on Mar. 9, 2018. The entirety of the above-mentioned patent application is hereby incorporated by reference herein and made a part of this specification.

BACKGROUND

Field of the Invention

The invention relates to a semiconductor fabrication technique and more particularly, to an apparatus and a method for controlling an operation of a machine.

Description of Related Art

During a fabrication procedure of a semiconductor device, a variety of required processes are involved with the completion of a structure to be formed. These processes must be performed on corresponding processing machines, which include, for example, an implantation process, an etching process, a deposition process and so on.

When a semiconductor workpiece is processed or fabricated by a processing machine, an operation condition is set based on a required structure goal. If the operation condition deviates from an expected tolerable range, the operation condition of the processing machine has to be adjusted.

Taking an implanter machine as an example, a condition of implanting beams thereof may influence a doped region and a doping concentration, for example. If the implanting beam condition deviates and fails to be normally operated in an expected condition, a typical manner relies on an operator to manually adjust the operation condition in accordance with his/her experience. Such manual adjustment is not only time-consuming, but also different in the adjustment process due to experience difference of the operators.

How to efficiently and systematically adjust the machines in replacement with the manpower is an issue to be considered.

SUMMARY

The invention provides an apparatus and a method for controlling an operation of a machine, capable of systematically adjusting a processing machine and achieving manpower saving and efficiency enhancement.

According to an embodiment of the invention, an apparatus for controlling an operation of a machine which includes an optical recognition system, a control unit and a remote control interface is provided. The optical recognition system monitors and obtains actual operation information displayed on a panel of a processing machine in accordance with an operation time. The control unit is configured to receive the actual operation information and check the actual operation information with expected operation information. The expected operation information is obtained based on an operation model which is already built up corresponding to a current fabrication process. Deviation information between the actual operation information and the expected operation information is determined and converted into a parameter set. The remote control interface receives the parameter set and converts the parameter set into a control signal set for controlling an operation of the processing machine.

According to an embodiment of the invention, a method for controlling an operation of a machine including the following steps is provided. By an optical recognition system, actual operation information displayed on a panel of a processing machine is monitored and obtained in accordance with an operation time. By a control unit, the actual operation information is received and checked with expected operation information. The expected operation information is obtained based on an operation model which is already built up corresponding to a current fabrication process. Deviation information between the actual operation information and the expected operation information is determined and converted into a parameter set. By a remote control interface, the parameter set is received and converted into a control signal set for controlling an operation of the processing machine.

According to an embodiment, for the apparatus and the method, the optical recognition system includes an optical character recognition system.

According to an embodiment, for the apparatus and the method, the control unit instructs the remote control interface to transmit a control signal to the processing machine to display a next page on the panel.

According to an embodiment, for the apparatus and the method, the control unit consults to a database to decide the corresponding operation model, so as to obtain a structure goal of the current fabrication process.

According to an embodiment, for the apparatus and the method, the control unit adjusts the parameter set when an abnormal operation is detected by the control unit.

According to an embodiment, for the apparatus and the method, the processing machine includes an implanter machine, wherein at least an implanting beam is monitored and adjusted in time according to the deviation information.

According to an embodiment, for the apparatus and the method, the control unit adjusts at least one parameter in the parameter set which includes parameters for adjusting a magnetic field source, an arc current, a beam position and a temperature.

According to an embodiment, for the apparatus and the method, the processing machine includes an etching machine, wherein at least an etching condition is monitored and adjusted in time according to the deviation information.

According to an embodiment, for the apparatus and the method, the processing machine includes a depositing machine, wherein at least a gas flow and a chamber temperature are monitored and adjusted in time according to the deviation information.

According to an embodiment, for the apparatus and the method, the control unit includes an artificial intelligence (AI) algorithm to decide the parameter set and generate the deviation information, wherein the AI algorithm allows the control unit to have a capability for machine learning, so as to adjust the operation model or create a new operation model in the database.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 is a schematic diagram showing a control mechanism of an implanter machine according to an embodiment of the present invention.

FIG. 6 is a flowchart showing a method for controlling an operation of a machine according to an embodiment of the present invention.

DESCRIPTION OF EMBODIMENTS

The invention is directed to an apparatus and a method for controlling an operation of a machine, and according to a concept related to artificial intelligence (AI), an operation condition capable of automatically adjusting a machine is provided to obtain a desired result.

In the invention, an optical character recognition (OCR) mechanism may be utilized to obtain information to be displayed on a display panel, so as to obtain an operation change of the machine in accordance with the time and adjust the operation condition of the machine according to a known operation mode. In addition, training related to the machine may also be allowed to be performed in the operation mode, so as to improve the operation mode or to create a new operation model.

Several embodiments are provided below for describing the invention; however, the invention is not limited by the embodiments provided below.

Figure 1:
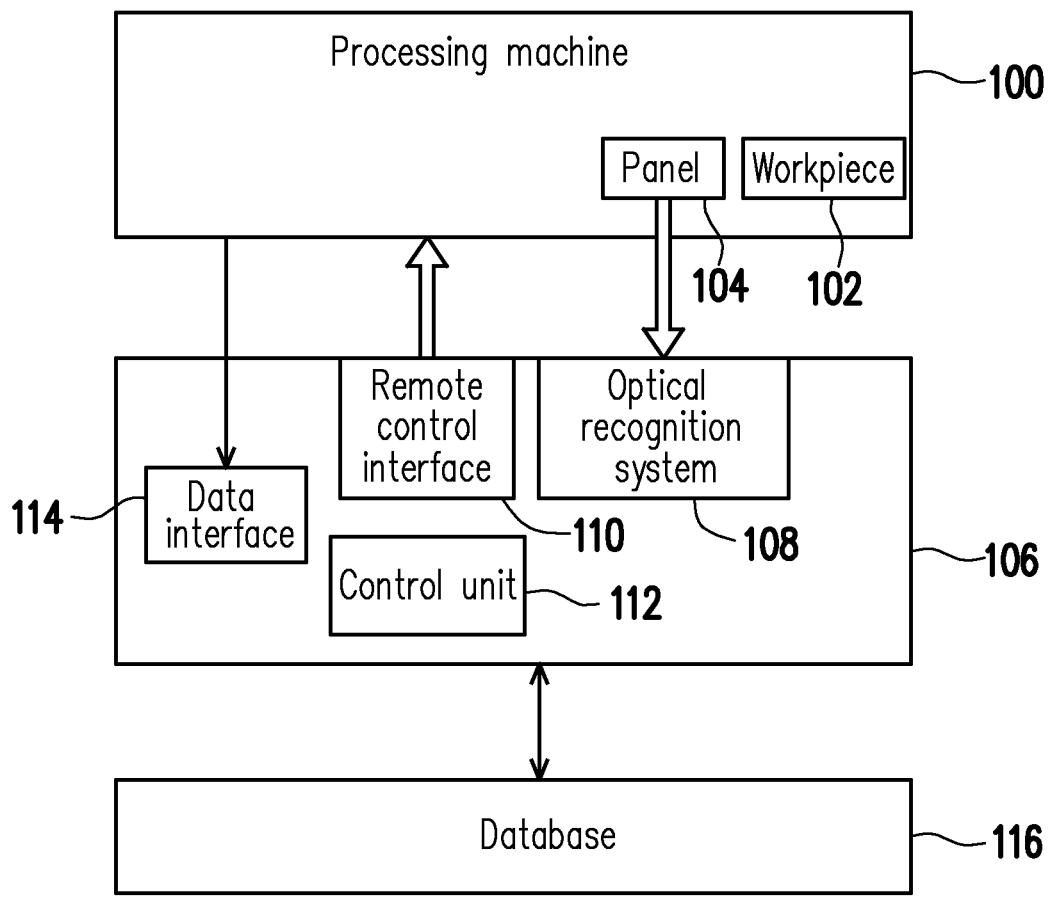
FIG. 1 is a schematic block diagram showing a structure of an apparatus for controlling an operation of a machine according to an embodiment of the present invention.

FIG. 1 is a schematic block diagram showing a structure of an apparatus for controlling an operation of a machine according to an embodiment of the present invention. Referring to FIG. 1, a control apparatus 106 for controlling an operation of a machine basically features in including an optical recognition system 108, a control unit 112, and a remote control interface 110. First, as for general features, the optical recognition system 108 monitors and obtains actual operation information displayed on a panel 104 of a processing machine 100 in accordance with an operation time. The control unit 112 is configured to receive the actual operation information and check the actual operation information with expected operation information. The expected operation information is obtained based on an operation model which is already built up corresponding to a current fabrication process. Deviation information between the actual operation information and the expected operation information is determined and converted into a parameter set. The remote control interface 110 receives the parameter set and converts the parameter set into a control signal set for controlling an operation of the processing machine 100.

The control unit 112 of the control apparatus 106 has an artificial intelligence (AI) mechanism and is capable of obtaining the expected operation information according to the operation model which is already built up in the database 116 and obtaining the actual operation information displayed on the panel 104 in time through the optical recognition system 108. Control parameters of the processing machine 100 may be adaptively adjusted by comparing the deviation between the actual operation information and the expected operation information based on the AI algorithm, and an effect of instant monitoring and automatic adjustment may also be achieved by doing so, for example.

The actual operation information of the processing machine 100 includes actual operation information displayed on the panel 104, which may be obtained by the optical recognition system 108. In an embodiment, the optical recognition system 108 includes, for example, an optical character recognition system. Additionally, if the processing machine 100 also includes some operation data not displayed on the panel 104, the operation data may also be directly obtained by a data interface 114 and provided to the control unit 112 for further reference. However, as for the invention, the actual operation information displayed on the panel 104 may be instantly obtained by the optical recognition system 108.

The control unit 112, for example, based on the AI algorithm, compares and the obtained actual operation information with the expected operation information and determines whether the operation condition of the processing machine 100 has to be adjusted. In an embodiment, if the operation condition of the processing machine 100 has to be adjusted, the control unit 112 converts the deviation information into the control signal set and adjusts the operation condition of the processing machine 100 through the remote control interface 110. Because the number of the control parameters for controlling the processing machine 100 is plural, and each of the control parameters requires a corresponding control signal for the adjustment, and thus the signals of the control signal set include one or more signals required to be adjusted, which is decided by the control unit 112.

The optical recognition system 108 is configured to recognize characters and is capable of directly reading the actual operation information displayed on the panel 104 in the same way as an operator does. The optical recognition system 108 may be generally applied to the processing machine 100 of various types, which is not particularly limited in the processing machine 100 of a specific purpose. The processing machine 100 may be, for example, an implanter machine, a depositing machine or an etching machine, or machines performing other processes.

Additionally, the processing machine 100 may be used in a process of fabricating a semiconductor workpiece 102, but may be in a non-fabrication process. In the invention, the adjustment on controlling the operation of the machine may be performed in accordance with a demand, which is not limited to a specific time period.

The information related to the processing machine 100 may be displayed on the panel 104 in a single-page display manner or a multi-page display manner. If the information related to the processing machine 100 is displayed on the panel in the single-page display manner, an image is maintained on the same page, however, values of the parameters may vary with the time. If the information is displayed on the panel 104 in the multi-page display manner, it may jump to a next page automatically or with a button.

Figure 2:
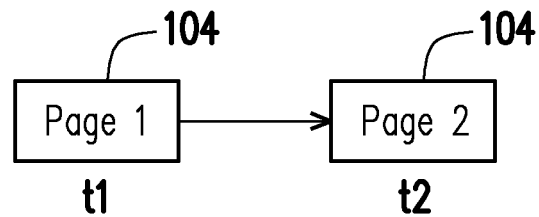
FIG. 2 is a schematic diagram showing the display mechanism of the panel of the processing machine according to an embodiment of the present invention.

FIG. 2 is a schematic diagram showing the display mechanism of the panel of the processing machine according to an embodiment of the present invention. Referring to FIG. 2, the multi-page display manner is taken as an example in the present embodiment, where information related to Page 1 is displayed at a time t1, and information related to a next page, i.e., Page 2, is displayed at a time t2. In a scenario that the next page is jumped to with the use of the button, the remote control interface 110 may issue an instruction to the processing machine 100 which instructs to jump to the next page. In this way, the multi-page information may be completely obtained by the control apparatus 106.

Figure 3:
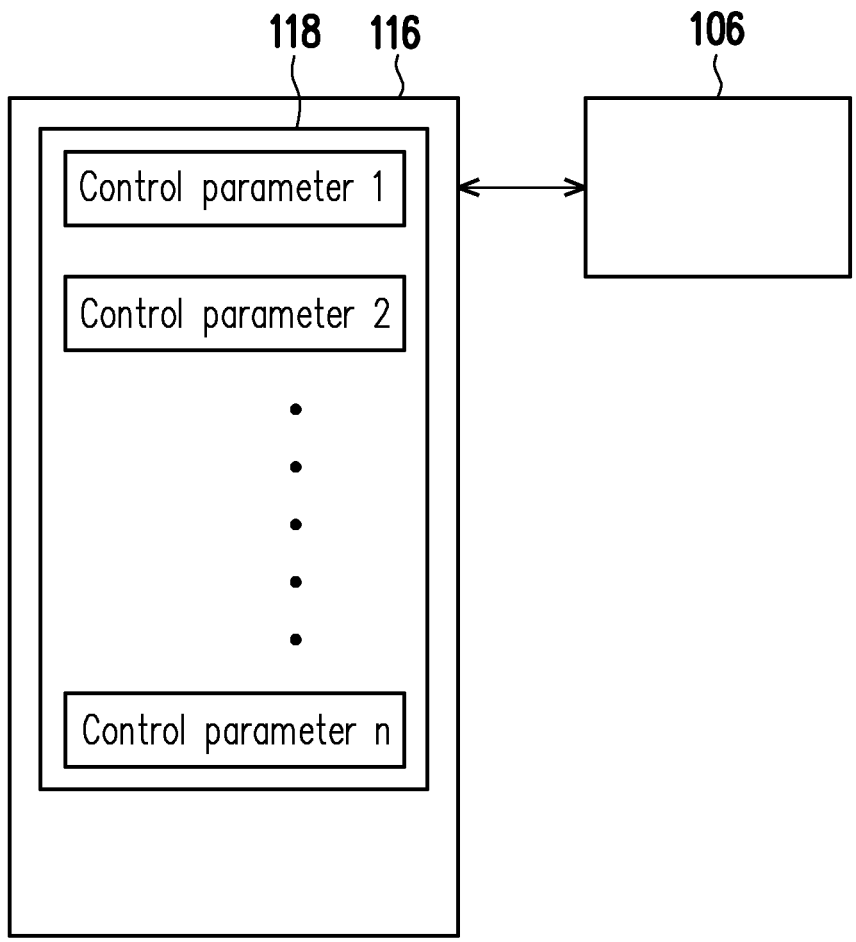
FIG. 3 is a schematic diagram showing information communication between the control apparatus and the database according to an embodiment of the present invention.

Regarding the contents of the database 116, the database 116 stores the expected operation information according to the operation model which is already built up. The operating information generally includes a plurality of control parameters which are associated with one another. FIG. 3 is a schematic diagram showing information communication between the control apparatus and the database according to an embodiment of the present invention.

Referring to FIG. 3, an operation model 118 in the database 116 generally includes a plurality of control parameters 1, 2, . . . and n, which generally includes operation conditions obtained by analyzing and summarizing a great amount of fabrication data corresponding to some structure goals. The operation model 118 may include a variety of fabrication processes, in which each of the process corresponds to a fabrication performed on the workpiece 102 by one processing machine 100. Based on the premise of the operation model 118, the processing machine 100 corresponding to a currently performed process requires the control parameters 1, 2 . . . and n for performing corresponding control. These control parameters 1, 2 . . . and n is at least a part for constituting the expected operation information and may be correspondingly adjusted. The control unit 112 of the control apparatus 106 may decide an overall adjustment of the control parameters 1, 2 . . . and n, for example, based on the AI algorithm, and the control parameters may be adjusted in part or overall, which depends on a degree of the deviation information.

The invention provides an AI control algorithm, for example, and thus, the contents of the operation model 118 may be trained and changed, so as to improve the control quality. Additionally, in an embodiment, the AI algorithm may also allow a new operation model 118 to be created in response to the actual fabrication procedure.

Figure 4:
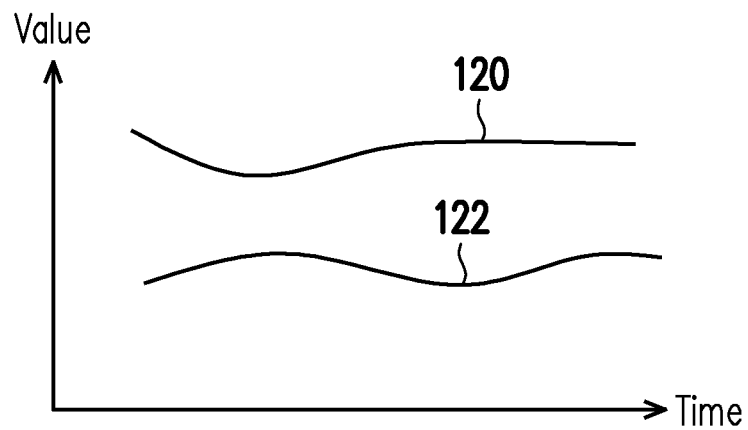
FIG. 4 is a schematic diagram showing a phenomenon that the control parameters change in accordance with the time according to an embodiment of the present invention.

FIG. 4 is a schematic diagram showing a phenomenon that the control parameters change in accordance with the time according to an embodiment of the present invention. Referring to FIG. 4, when the workpiece 102 is being fabricated by the processing machine 100, the values of the control parameters change with time. For example, a curve 120 of a value of a control parameter 1 and a curve 122 of a value of a control parameter 2 change with the time, but are associated with each other. Thus, the actual operation information obtained by the optical recognition system 108 includes time factors for analysis and adjustment. The control apparatus 106 includes, for example, a software for performing AI determination and a hardware, such as a processor and so on. That is to say, the software is an execution program and is implemented by the hardware, e.g., the processor. The invention is not limited to any specific processing architecture.

FIG. 5 is a schematic diagram showing a control mechanism of an implanter machine according to an embodiment of the present invention. Referring to FIG. 5, an implanter machine is taken as an example of the processing machine 100, and a wafer 10 is taken as an example of the workpiece 102 of the processing machine 100. For example, an ion implantation process is to be performed on the wafer 10. Generally, an implantation material of plasma 26 may be formed in a space surrounded by a side wall 12. Some control elements may be required for the side wall 12 based on an actual demand, which are provided with a voltage by a power source 12a. A condition of the plasma 26 is controlled by, for example, a power controller 18. A gas unit 14 provides a gas for the ion implantation. A vacuum unit 24 controls a pressure of a chamber to reach a required vacuum degree. A mesh electrode element 20 is controlled by a power unit 22, such that ions 28 of a dopant are implanted on the wafer 10 through the mesh electrode element 20. A temperature unit 30 controls an operating temperature of the entire chamber.

The above is merely schematic description related to the processing machine 100, but one with ordinary skills in the art may understand the processing machine 100 in an actual scenario, which will not be continuously described. According to an aspect of the processing machine 100 for the implantation process, in order to achieve the control on the energy and the concentration of an implanting beam, the processing machine 100 for the implantation process requires various control parameters in a whole for achieving an expected operation condition. The operation models constituted by these control parameters are built in the database, which are treated as a basis for adjustment.

FIG. 6 is a flowchart showing a method for controlling an operation of a machine according to an embodiment of the present invention. Referring to FIG. 6, according to an aspect of an operating method, the invention provides a method for controlling an operation of a machine, which includes the following steps. In step S100, by an optical recognition system 108, actual operation information displayed on a panel 104 of a processing machine 100 is monitored and obtained in accordance with an operation time. In step S102, by a control unit 112, the actual operation information is received and checked with expected operation information. The expected operation information is obtained based on an operation model 118 which is already built up corresponding to a current fabrication process. Deviation information between the actual operation information and the expected operation information is determined and converted into a parameter set. In step S104, by a remote control interface 110, the parameter set is received and converted into a control signal set for controlling an operation of the processing machine.

As for the apparatus and the method for controlling the operation of the machine, specific features may also be respectively described as follows according to a plurality of embodiments.

According to an embodiment, for the apparatus and the method, the optical recognition system includes an optical character recognition system.

According to an embodiment, for the apparatus and the method, the control unit instructs the remote control interface to transmit a control signal to the processing machine to display a next page on the panel.

According to an embodiment, for the apparatus and the method, the control unit consults to the database to decide the corresponding operation model, so as to obtain a structure goal of the current fabrication process.

According to an embodiment, for the apparatus and the method, the control unit adjusts the parameter set when an abnormal operation is detected by the control unit.

According to an embodiment, for the apparatus and the method, the processing machine includes an implanter machine, wherein at least an implanting beam is monitored and adjusted in time according to the deviation information.

According to an embodiment, for the apparatus and the method, the control unit adjusts at least one parameter in the parameter set which includes parameters for adjusting a magnetic field source, an arc current, a beam position and a temperature.

According to an embodiment, for the apparatus and the method, the processing machine includes an etching machine, wherein at least an etching condition is monitored and adjusted in time according to the deviation information.

According to an embodiment, for the apparatus and the method, the processing machine includes a depositing machine, wherein at least a gas flow and a chamber temperature are monitored and adjusted in time according to the deviation information.

According to an embodiment, for the apparatus and the method, the control unit includes an AI algorithm to decide the parameter set and generate the deviation information, wherein the AI algorithm allows the control unit to have a capability for machine learning, so as to adjust the operation model or create a new operation model in the database.

It should be mentioned that each of the embodiments is merely used to the technical solution of the invention, instead of construing any limitations the invention. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for controlling an operation of a machine, comprising:
    an optical recognition system, monitoring and obtaining an actual operation information displayed on a panel of a processing machine in accordance with an operation time, wherein the actual operation information at least comprises a control parameter displayed in a single-page or multi-page display manner;
    a control unit, configured to receive the actual operation information and check the actual operation information with expected operation information, wherein the expected operation information is obtained based on an operation model which is already built up corresponding to a current fabrication process, wherein deviation information between the actual operation information and the expected operation information is determined and converted into a parameter set; and
    a remote control interface, receiving the parameter set and converting the parameter set into a control signal set for controlling an operation of the processing machine,
    wherein the control unit comprises an artificial intelligence (AI) algorithm to decide the parameter set and generate the deviation information, wherein the AI algorithm allows the control unit to have a capability for machine learning, so as to adjust the operation model or create a new operation model in the database.

2. The apparatus according to claim 1, wherein the optical recognition system comprises an optical character recognition system.

3. The apparatus according to claim 1, wherein the control unit instructs the remote control interface to transmit a control signal to the processing machine to display a next page on the panel.

4. The apparatus according to claim 1, wherein the control unit consults to a database to decide the corresponding operation model, so as to obtain a structure goal of the current fabrication process.

5. The apparatus according to claim 1, wherein the control unit adjusts the parameter set when an abnormal operation is detected by the control unit.

6. The apparatus according to claim 1, wherein the processing machine comprises an implanter machine, wherein at least an implanting beam is monitored and adjusted in time according to the deviation information.

7. The apparatus according to claim 6, wherein the control unit adjusts at least one parameter in the parameter set which comprises parameters for adjusting a magnetic field source, an arc current, a beam position and a temperature.

8. The apparatus according to claim 1, wherein the processing machine comprises an etching machine, wherein at least an etching condition is monitored and adjusted in time according to the deviation information.

9. The apparatus according to claim 1, wherein the processing machine comprises a depositing machine, wherein at least a gas flow and a chamber temperature are monitored and adjusted in time according to the deviation information.

10. A method for controlling an operation of a machine, comprising:
    by an optical recognition system, monitoring and obtaining an actual operation information displayed on a panel of a processing machine in accordance with an operation time, wherein the actual operation information at least comprises a control parameter displayed in a single-page or multi-page display manner;
    by a control unit, receiving the actual operation information and checking the actual operation information with expected operation information, wherein the expected operation information is obtained based on an operation model which is already built up corresponding to a current fabrication process, wherein deviation information between the actual operation information and the expected operation information is determined and converted into a parameter set; and
    by a remote control interface, receiving the parameter set and converting the parameter set into a control signal set for controlling an operation of the processing machine,
    wherein the control unit comprises an AI algorithm to decide the parameter set and generate the deviation information, wherein the AI algorithm allows the control unit to have a capability for machine learning, so as to adjust the operation model or create a new operation model in the database.

11. The method according to claim 10, wherein the optical recognition system comprises an optical character recognition system.

12. The method according to claim 10, wherein the control unit instructs the remote control interface to transmit a control signal to the processing machine to display a next page on the panel.

13. The method according to claim 10, wherein the control unit consults to a database to decide the corresponding operation model, so as to obtain a structure goal of the current fabrication process.

14. The method according to claim 10, wherein the control unit adjusts the parameter set when an abnormal operation is detected by the control unit.

15. The method according to claim 10, wherein the processing machine comprises an implanter machine, wherein at least one implanting beam is monitored and adjusted in time according to the deviation information.

16. The method according to claim 15, wherein the control unit adjusts at least one parameter in the parameter set which comprises parameters for adjusting a magnetic field source, an arc current, a beam position and a temperature.

17. The method according to claim 10, wherein the processing machine comprises an etching machine, wherein at least an etching condition is monitored and adjusted in time according to the deviation information.

18. The method according to claim 10, wherein the processing machine comprises a depositing machine, wherein at least a gas flow and a chamber temperature are monitored and adjusted in time according to the deviation information.

\* \* \* \* \*